(12) United States Patent
Lin et al.

(10) Patent No.: US 6,777,045 B2
(45) Date of Patent: Aug. 17, 2004

(54) CHAMBER COMPONENTS HAVING TEXTURED SURFACES AND METHOD OF MANUFACTURE

(75) Inventors: Shyh-Nung Lin, Los Gatos, CA (US); Mark D. Menzie, Sunnyvale, CA (US); Joe F. Sommers, San Jose, CA (US); Daniel Owen Clawson, Santa Clara, CA (US); Glen T. Mori, Pacifica, CA (US); Lolita L. Sharp, Los Gatos, CA (US)

(73) Assignee: Applied Materials Inc., Santa Clara, CA (US)

( * ) Notice: Subject to any disclaimer, the term of this patent is extended or adjusted under 35 U.S.C. 154(b) by 116 days.

(21) Appl. No.: 09/895,862

(22) Filed: Jun. 27, 2001

(65) Prior Publication Data

US 2003/0026917 A1 Feb. 6, 2003

(51) Int. Cl.[7] .................... B32B 1/08; B32B 17/06; H01L 21/306; C23C 16/00; C23C 14/00
(52) U.S. Cl. ............... 428/34.6; 428/426; 428/432; 156/916; 156/914; 156/345.3; 156/345.35; 204/298.3; 118/723 VE; 118/723 R
(58) Field of Search ................. 428/34.6, 426, 428/432; 156/916, 914, 345.3, 345.35; 204/298.3; 118/723 VE, 723 R

(56) References Cited

U.S. PATENT DOCUMENTS

| 4,419,201 A | * | 12/1983 | Levinstein et al. ........ 156/914 |
| 4,491,496 A |   | 1/1985  | Laporte et al. ............ 156/345 |
| 4,717,462 A |   | 1/1988  | Homma et al. ............. 204/298 |
| 5,180,322 A | * | 1/1993  | Yamamoto et al. ........... 445/37 |
| 5,549,802 A |   | 8/1996  | Guo ..................... 204/298.11 |
| 5,587,039 A | * | 12/1996 | Salimian et al. ....... 156/345.41 |
| 5,762,748 A |   | 6/1998  | Banholzer et al. |
| 5,858,100 A |   | 1/1999  | Maeda et al. ............... 118/719 |
| 5,879,523 A |   | 3/1999  | Wang et al. .......... 204/298.11 |
| 5,903,428 A |   | 5/1999  | Grimard et al. ............ 361/234 |
| 5,916,378 A |   | 6/1999  | Bailey et al. ............... 148/243 |

(List continued on next page.)

FOREIGN PATENT DOCUMENTS

| DE | 19719133 A1 | 11/1998 |
| EP | 0838838 A2  | 4/1998  |
| JP | 54162969    | 12/1979 |
| WO | 9917336     | 4/1999  |

OTHER PUBLICATIONS

European Patent Office, PCT International Search Report for International Application No. PCT/US 02/20095.

*Primary Examiner*—Harold Pyon
*Assistant Examiner*—Chris Bruenjes
(74) *Attorney, Agent, or Firm*—Ashok K. Janah

(57) ABSTRACT

A domed enclosure wall for a plasma processing chamber is made from a dielectric material having a roughened surface with a roughness average of from about 150 to about 450 microinches. A plasma sprayed ceramic coating is applied on the roughened surface of the dielectric material. The plasma sprayed coating comprises a textured surface having a roughness with an average skewness that is a negative value. When the enclosure wall is used in a plasma processing chamber, sputtered material generated by a plasma formed in a plasma processing chamber has good adherence to the textured surface.

35 Claims, 7 Drawing Sheets

U.S. PATENT DOCUMENTS

| | | | | |
|---|---|---|---|---|
| 5,953,827 A | | 9/1999 | Or et al. | 34/58 |
| 5,976,327 A | | 11/1999 | Tanaka | 204/192.15 |
| 6,007,673 A | * | 12/1999 | Kugo et al. | 156/916 |
| 6,015,465 A | | 1/2000 | Kholodenko et al. | 118/719 |
| 6,051,114 A | | 4/2000 | Yao et al. | 204/192.3 |
| 6,059,945 A | | 5/2000 | Fu et al. | 204/298.12 |
| 6,120,621 A | * | 9/2000 | Jin et al. | 148/437 |
| 6,120,640 A | * | 9/2000 | Shih et al. | 156/914 |
| 6,152,071 A | * | 11/2000 | Akiyama et al. | 204/298.38 |
| 6,223,684 B1 | * | 5/2001 | Fujioka et al. | 156/916 |
| 6,306,498 B1 | | 10/2001 | Yuuki et al. | |
| 6,338,906 B1 | * | 1/2002 | Ritland et al. | 428/539.5 |
| 2001/0033706 A1 | * | 10/2001 | Shimomura et al. | 384/569 |
| 2002/0086118 A1 | | 7/2002 | Chang et al. | |

\* cited by examiner

CHAMBER COMPONENTS HAVING TEXTURED SURFACES AND METHOD OF MANUFACTURE

BACKGROUND

Embodiments of the present invention relate to a process chamber for processing a substrate.

A process chamber is capable of processing a substrate in an energized process gas. The process chamber comprises an enclosure wall that encloses a process zone into which a process gas may be introduced, a gas energizer to energize the process gas, and an exhaust to exhaust the process gas. Typically, the enclosure wall is smooth to facilitate post-process cleaning of the enclosure wall. A process chamber may, for example, be used to deposit material on a substrate or to etch material from a substrate, for example, by sputter etching a substrate surface before a subsequent deposition process is conducted on the substrate. The sputter etching process may, for example, remove a native oxide layer from the surface of a metal layer before a metal deposition step so that the deposited metal can make good electrical contact with the underlying metal layer of the substrate.

During such sputter cleaning of the substrate, the material that is etched from the substrate can often redeposit on the substrate instead of depositing on other surfaces in the chamber. Also, material that is etched from the substrate that deposits on the enclosure wall can flake off into the process zone and fall upon and contaminate the substrate, for example, because a rise in temperature of the enclosure wall causes thermal expansion mismatch stresses which cause the deposits to flake off from the wall. In addition, outgassing of volatile material trapped in the enclosure wall can occur when the enclosure is pumped out to low vacuum pressures. These materials can further contribute to lower substrate yields.

Thus, it is desirable to have a process chamber that is capable of processing a substrate, for example by sputter etching the substrate, with reduced redeposition on or contamination of the substrate. It is also desirable to minimize outgassing from the enclosure wall of the process chamber.

SUMMARY

A domed enclosure wall for a plasma processing chamber comprising a dielectric material having a roughened surface with a roughness average of from about 150 to about 450 microinches; and a plasma sprayed ceramic coating deposited on the roughened surface of the dielectric material, the plasma sprayed ceramic coating comprising a textured exposed surface having a roughness with an average skewness that is a negative value, whereby sputtered material generated by a plasma in a plasma processing chamber may adhere to the textured exposed surface.

A substrate processing apparatus comprising a chamber comprising a domed enclosure wall comprising (i) a dielectric material having a roughened surface with a roughness average of from about 150 to about 450 microinches, and (ii) a plasma sprayed ceramic coating deposited on the roughened surface of the dielectric material, the plasma sprayed ceramic coating comprising a textured exposed surface having a roughness with an average skewness that is a negative value; a substrate support in the chamber; a gas supply to provide a process gas into the chamber; a plasma generator to form a plasma of the process gas in the chamber to process the substrate; and an exhaust conduit to exhaust the process gas, whereby sputtered material generated by a plasma in the chamber may adhere to the textured exposed surface.

A method of fabricating a domed enclosure wall of a plasma processing chamber comprising providing a domed shaped dielectric preform; roughening a surface of the dielectric preform to form a roughened surface having a roughness average of from about 150 to about 450 microinches; and depositing a plasma sprayed ceramic coating on the roughened surface of the dielectric preform so that the plasma sprayed ceramic coating comprises a textured exposed surface having a roughness with an average skewness that is a negative value.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

Figure 7:
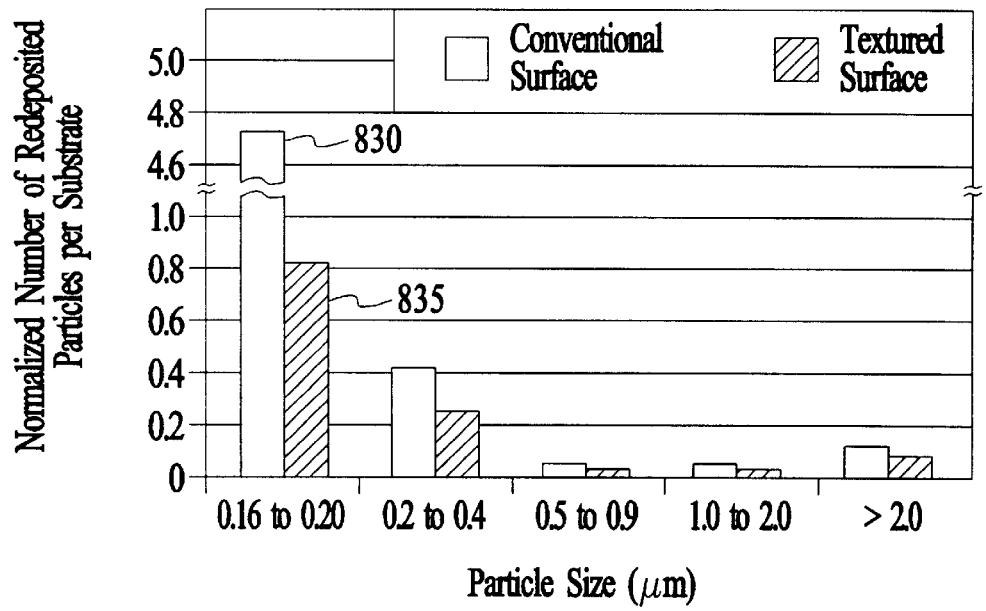
Figure 8:
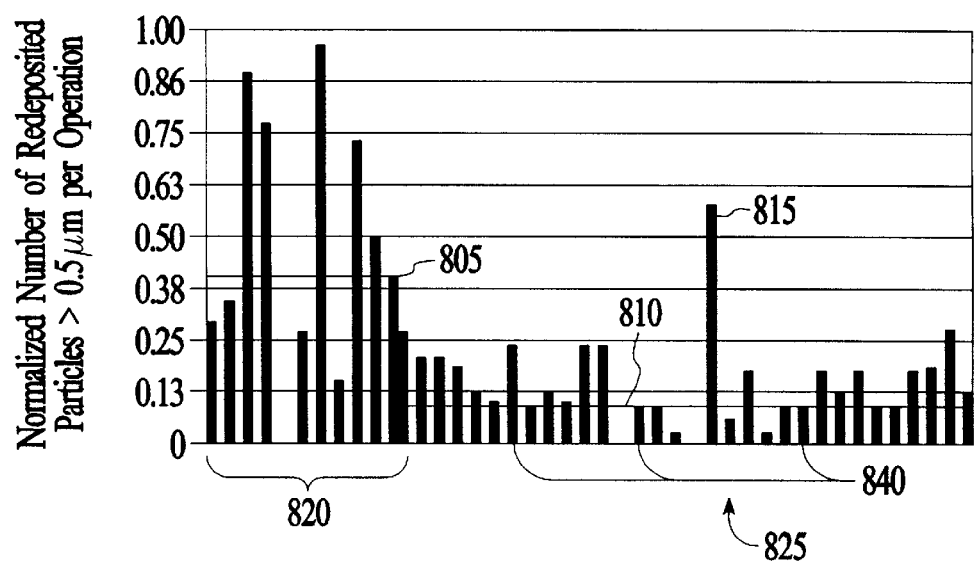

FIG. 7 is a comparative bar graph of a normalized number of redeposited particles per substrate at different particle size ranges and for a conventional surface and a textured surface according to the present invention; and FIG. 8 is a comparative bar graph of a normalized number of redeposited particles per substrate of a process chamber for a conventional surface and a textured surface according to the present invention.

DESCRIPTION

Figure 1:
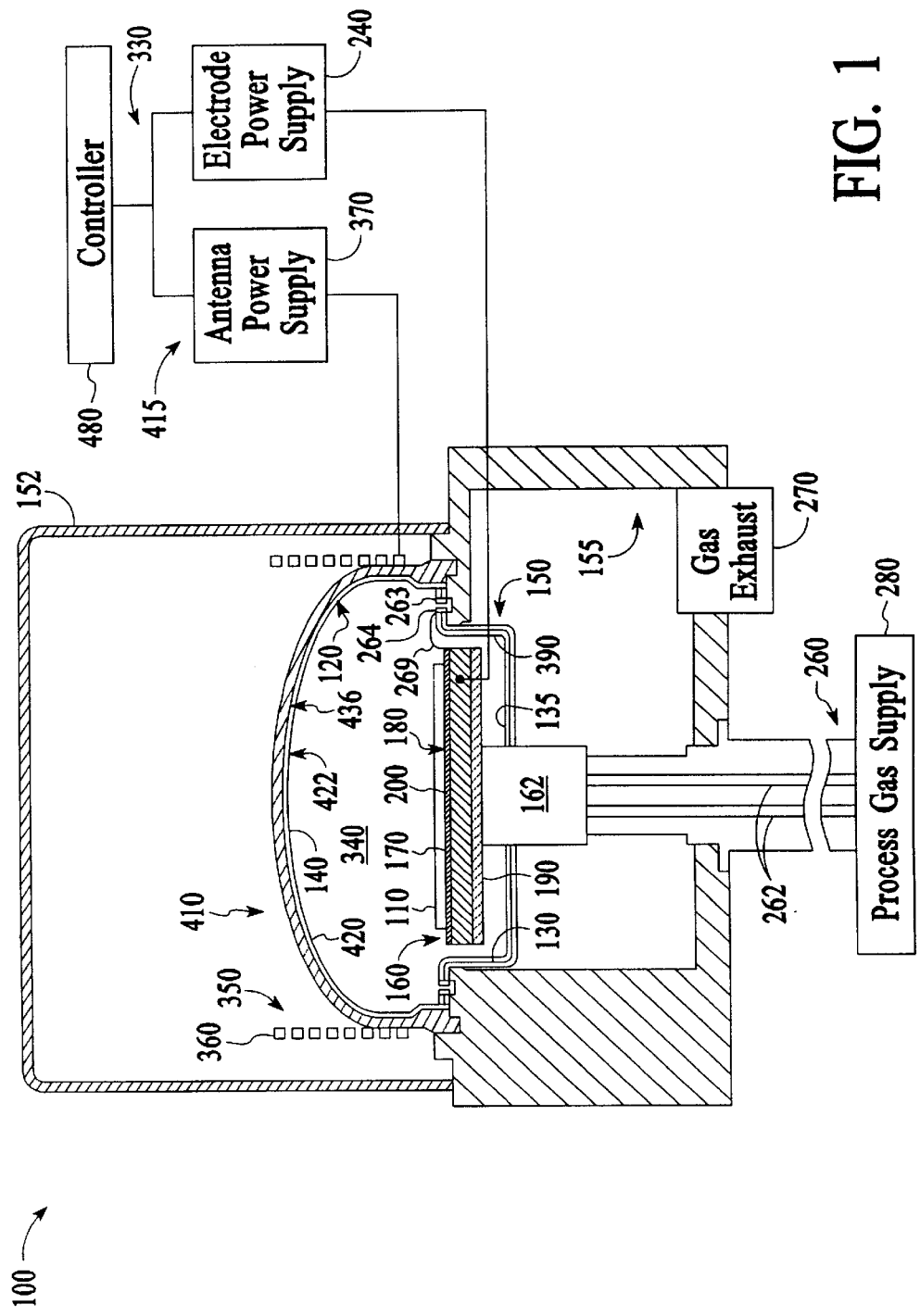
FIG. 1 is a process chamber according to an embodiment of the present invention.

A process chamber 100, an embodiment of which is illustrated in FIG. 1, may be used for many different types of substrate processing, including for example, deposition and etching processes. For example, in the chamber 100, a gas may be energized to sputter etch material from a substrate 110 by bombardment of the substrate with ions and neutral particles, to for example clean and prepare the surface of the substrate 110 for subsequent processes. As the particles of the gas bombard the substrate 110, the substrate material is sputter etched off the substrate 110 to provide the desired substrate surface. The substrate 110 may comprise a wafer comprising semiconductor, dielectric, or conductor layers. The semiconductor layers may include silicon-containing material such as elemental silicon or silicon compounds. The dielectric layers may include silicon dioxide, undoped silicate glass, phosphosilicate glass (PSG), borophosphosilicate glass (BPSG), $Si_3N_4$, or TEOS deposited glass. The conductor layers may include aluminum, copper tungsten silicide, and cobalt silicide. The substrate 110 may undergo the sputter etch cleaning step before it undergoes a deposition step, such as a metal deposition step. In one embodiment, the process chamber 100 cleans a native oxide layer (not shown) that has developed through oxidation on an underlying metal layer (not shown), so that a subsequent metal deposition step can deposit a metal layer that makes good electrical contact with the underlying metal layer.

A portion or all of the process chamber 100 may be fabricated from metal or ceramic materials. Metals that may be used to fabricate the process chamber 100 include aluminum, anodized aluminum, "HAYNES 242," "Al-6061," "SS 304," "SS 316," and INCONEL, of which anodized aluminum is sometimes preferred. Suitable ceramic materials include quartz or alumina. For example, in one version, the process chamber 100 comprises an enclosure wall 120 that is fabricated from a ceramic material that is substantially permeable to RF wavelengths, such as quartz. The enclosure wall 120 may serve as a sidewall 130, bottom wall 135, or ceiling 140 of the chamber 100, or may be an internal wall such as a liner (not shown) positioned adjacent to the sidewalls 130 or ceiling 140. The enclosure wall 120 may be domed shaped to serve as a bell-jar type enclosure that is a separate structure from the sidewall 130 and bottom wall 135 of the chamber 100. The domed enclosure wall 120 may be a cylindrical dome, hemispherical dome, or other single or multiple radius arcuate shaped dome, and is preferably fabricated as a unitary structure.

The process chamber 100 comprises a substrate support 160 to support the substrate 110 in the process chamber 100. The support 160 may comprise an electrode 200 covered by a dielectric layer 170 having a substrate receiving surface 180. An electrode power supply 240 provides a DC or AC bias voltage, for example, an RF bias voltage, to the electrode 200 to energize the gas. Below the electrode 200 is a dielectric plate 190, such as a quartz plate, to electrically isolate the electrode 200 from the other walls 120 of the chamber 100, some of which may be electrically grounded or floating or which may be otherwise electrically biased relative to the electrode 200. The electrically biased electrode 200 allows etching of the substrate 110 by energizing and accelerating the sputter ions toward the substrate 110. At least a portion the wall 120 that is electrically conducting is preferably grounded, so that a negative voltage may be maintained on the substrate 110 with respect to the grounded or floated enclosure wall 120. Optionally, the support 160 may also include an electrostatic chuck (not shown) capable of electrostatically holding the substrate 110 to the support 160, or a DC voltage may be applied to the electrode 200 to generate the electrostatic attractive forces.

The electrode 200 may also comprise one or more conduits (not shown) extending therethrough, such as for example, a gas conduit (not shown) provided to supply heat transfer gas from a heat transfer gas supply (not shown) to the surface 180. The heat transfer gas, typically helium, promotes heat transfer between the substrate 110 and the support 160. Other conduits (not shown) allow lift pins (not shown) to extend through the electrode 200 for loading or unloading of the substrate 110 by a lift mechanism (not shown). The process chamber 100 may also comprise a support lifting mechanism 162 to raise or lower the support 160 in the process chamber 100 to improve, or change the nature of, the processing of the substrate 110.

The wall 120 of the process chamber 100 may also serve as a gas shield 150 to shield parts of the chamber 100 from the energized process gas. For example, the gas shield 150 may substantially shield the lower chamber walls 155 from the process gas. The gas shield 150 also receives and collects the sputtered material from the substrate 110. The gas shield 150 may be suspended within the chamber 100 and include an annular ring 390 on which a clamp ring (not shown) or a collimator (not shown) may be suspended over the support 160 when the support 160 is retracted downwardly in the process chamber 100. In one embodiment, the gas shield 150 is made of aluminum and coated with a thin layer of aluminum oxide. The process chamber 100 may further comprise an electric-magnetic shield 152 to prevent electrical or magnetic fields external to the process chamber 100 from interfering with the operation of the chamber 100. The electric-magnetic shield 152 comprises a material suitable to provide electrical or magnetic shielding, such as a conducting or magnetic alloy.

The process chamber 100 also comprises a gas supply 260 to distribute a process gas into the chamber 100 and a gas exhaust 270 to exhaust the process gas from the chamber 100. In sputter etching, the process gas comprises an inert gas, such as argon or xenon, which does not chemically interact with the substrate material. The gas supply 260 may comprise a process gas supply 280 to supply the process gas and one or more gas conduits 262 to introduce the process gas into the chamber 100 via gas inlets 263, which in one embodiment, are positioned around the periphery of the substrate 110 to introduce the process gas near the substrate 110. For example, the gas supply 260 may comprise about 1 to about 10 gas inlets. Optionally, the gas supply 260 may further comprise a gas trench cover 264 to evenly distribute the flow of the process gas into the chamber 100. The gas trench cover 264 may be coated with a protective coating. The gas inlets 263 are positioned in the gas trench cover 264 to provide uniform dispersion of the process gas in the chamber 100.

The process chamber 100 further comprises one or more mass flow controllers (not shown) to control the flow of the process gas into the chamber 100. The gas exhaust 270 may comprise a pumping channel (not shown) that receives spent process gas, a throttle valve (not shown) to control the pressure of process gas in the chamber 100, and one or more exhaust pumps (not shown). The exhaust pump may comprise, for example, a mechanical pump or a turbo pump, such as a 350 l/s Leybold turbo pump. The gas exhaust 270 may also contain a system for abating undesirable gases from the process gas.

The gas composition and pressure in the chamber 100 is typically achieved by evacuating the chamber 100 down to at least about $10^{-7}$ Torr before back-filling the chamber 100 with argon to a pressure of a few milliTorr. At these gas pressures, the support 160 can be raised upward within the chamber 100. In one embodiment, the process chamber 100 comprises a knob (not shown) that can be rotated by an operator to adjust the height of the substrate 110 in the process chamber 100.

The process chamber 100 further comprises a plasma generator 330 to energize the process gas into a plasma. The plasma generator 330 couples energy to the process gas in a process zone 340 of the process chamber 100 (as shown), or in a remote zone upstream from the process chamber 100 (not shown). In one version, the plasma generator 330 comprises an antenna 350 comprising one or more inductor coils 360. The inductor coils 360 may have a circular symmetry about the center of the process chamber 100.

Typically, the antenna 350 comprises one or more solenoids shaped and positioned to provide a strong inductive flux coupling to the process gas. When the antenna 350 is positioned near the ceiling 140 of the process chamber 100, the adjacent portion of the ceiling 140 may be made from a dielectric material, such as silicon dioxide, which is transparent to the electromagnetic radiation emitted by the antenna 350, such as RF power. An antenna power supply 370 provides, for example, RF power to the antenna 350 at a frequency of typically about 50 kHz to about 60 MHz, and more typically about 400 kHz; and at a power level of from about 100 to about 5000 Watts. An RF match network (not shown) may also be provided to match the RF power to an impedance of the process gas. In another version, the plasma generator 330 comprises the electrode 200 to create an electric field in the process zone 340 to energize the process gas. In this version, an electrode power supply (not shown) provides power to the electrode 200, such as at a frequency of from about 50 kHz to about 60 MHz, and more typically about 13.56 MHz. Alternatively or additionally, the plasma generator 330 may comprise a microwave gas activator (not shown).

One or more components 410 of the chamber 100 have an textured exposed surface 422 that is exposed to the environment inside the chamber 100 and that is textured to enhance the substrate processing properties provided by the chamber 100. The textured exposed surface 422 may be an surface of a component 410 that is at least partially exposed to the energized gas, such as a plasma, that is formed in the chamber 100. If the textured exposed surface 422 is subject to deposition or bombardment by energetic ion and neutral species in the plasma, the component 410 having the textured exposed surface 422 thereon, may need to be occasionally replaced. In one version, the component 410 having the textured surface 422 comprises a domed enclosure wall 120 that serves as the ceiling 140 of the chamber 100.

Figure 2:
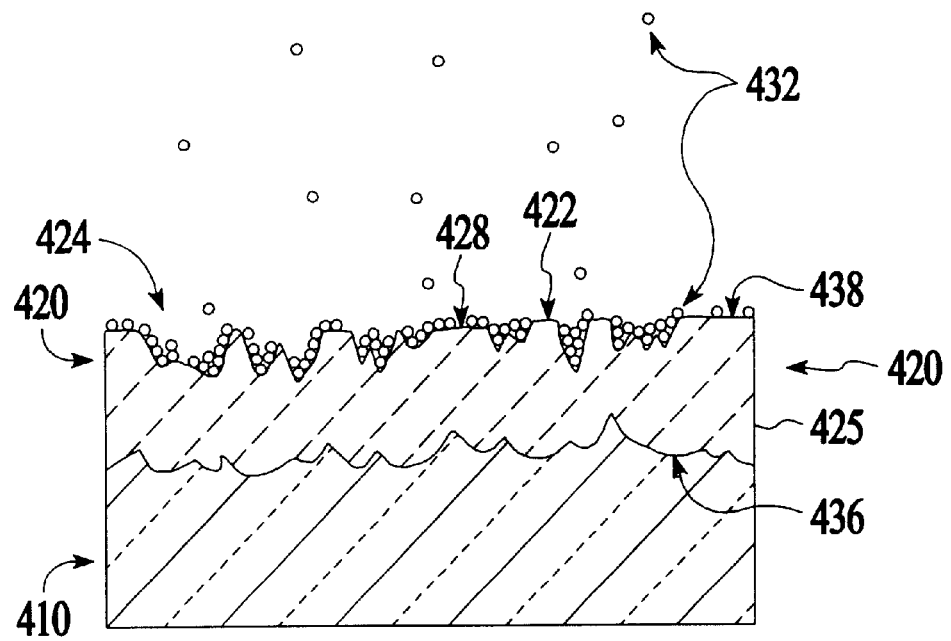
FIG. 2 is a cross-sectional partial view of a component having a textured exposed surface with a surface roughness having a negative skewness and showing the adhesion of sputtered particles to the textured exposed surface.

In one version, the textured exposed surface 422 has a roughness with a skewness that significantly and unexpectedly improves the adhesion and retention of sputtered materials onto the textured exposed surface 422 as illustrated in FIG. 2. Adhesion and retention of the sputtered particles is desirable to reduce redeposition of the particles onto the substrate, and to reduce flaking off of accumulated deposits formed on the textured exposed surfaces. The skewness ($R_{sk}$) is determined using the following formula:

$$R_{sk} = \frac{1}{R_q^3} \frac{1}{N} \sum_{j=1}^{N} Z_j^3$$

where $R_q = \sqrt{\frac{\sum_{i=1}^{N} Z_i^2}{N}}$ is the root mean square roughness of the surface 422, N is a number of sample points of the surface 422 used to make each skewness measurement, and $Z_1, Z_2, \ldots Z_N$ are the height deviations from the mean line measured at the sample points. The skewness is a measure of the asymmetry of the surface profile about the mean line. A surface having negative skewness 422, as shown in FIG. 2, has concavities 424, such as pits, extending into the surface 422, and may also have substantially flat areas 428 distributed between mainly concavities 424. The skewness should be sufficiently negative to allow the sputtered or other material that is formed in the chamber to contact and adhere to the textured exposed surface 422. Suitable skewness values can range from about −0.7 to about 0.1, or even from about −0.5 to about 0.

In one embodiment, the average skewness of the textured exposed surface 422, which represents the average of a number of measured skewness values across the surface 422, is a negative value (less than zero) such as less than about −0.1. The negative average skewness of the textured surface 422 provides a surface morphology that has been found to unexpectedly improve the adhesion and retention of sputter etched and other particles formed in the chamber to thereby improve chamber performance and substrate yields. While it is desirable for the average skewness value to be negative, it should be understood that individually measured skewness values may be negative or may be positive, so long as the average of a number of such individual values is a negative value. It is believed that a textured exposed surface 422 having a negative average skewness promotes adhesion of the particulate matter formed in the chamber 100, such as sputter etched particles, by allowing the troughs and valleys present in such a surface 422 to have a better grip to the particles.

Another property of the textured exposed surface 422 that may be used to characterize the surface 422 is the roughness average of the surface that is the mean of the absolute values of the displacements from the mean line of the peaks and valleys of the roughness features along the textured exposed surface 422. The roughness average, skewness, or other properties may be determined by a profilometer that passes a needle over the surface 422 and generates a trace of the fluctuations of the height of the asperities on the surface 422, or by a scanning electron microscope that uses an electron beam reflected from the surface 422 to generate an image of the surface 42. In one version, a component 410 is cut into coupons (not shown), and one or more measurements are made at each coupon to determine the skewness of each coupon. These skewness measurements are then averaged to determine an average skewness of the surface 422. In one embodiment, three coupons are used and four traces of the changes in the heights of the roughness peaks and valleys are made on each coupon. For example, when measuring the surface 422 of the ceiling 140, one coupon is at the top, substantially flat portion of the ceiling 140, a second coupon is at a side, substantially flat portion of the ceiling 140, and a third coupon is at a curving portion of the ceiling 140. The average skewness of the textured surface 422 that is a negative value was found to significantly improve the adhesion and retention of sputtered material. A suitable roughness average value is from about 150 microinches (~3 micrometers) to about 450 microinches (~18 micrometers), or from about ~360 microinches (~9 micrometers) to about 400 microinches (~10 micrometers).

Yet another property of the textured exposed surface 422 that may be used to characterize the surface 422 is the average peak slope value of the surface roughness. In one embodiment, the average peak slope value of the textured surface 422 may be selected to be from about 20 to about 25. Yet another property may be a measurement of the number of surface peaks that exceed the height of a mean height line through the roughness peaks and valleys. For example, the value of the peaks over the mean line for the textured surface 422 may be selected to be from about 175 to about 225.

In measuring properties of the surface 422 such as roughness average, skewness, or other characteristics, the international standard ANSI/ASME B.46.1-1995 specifying appropriate cut-off lengths and evaluation lengths, can be used. The following Table I shows the correspondence between values of roughness average, appropriate cut-off length, and minimum and typical evaluation length as defined by this standard:

TABLE I

| Roughness Average | Cut-off Length | Min. Evaluation Length | Typ. Evaluation Length |
| --- | --- | --- | --- |
| 0 to 0.8 microinches | 0.003 inches | 0.016 inches | 0.016 inches |
| 0.8 to 4 microinches | 0.010 inches | 0.050 inches | 0.050 inches |
| 4 to 80 microinches | 0.030 inches | 0.160 inches | 0.160 inches |
| 80 to 400 microinches | 0.100 inches | 0.300 inches | 0.500 inches |
| 400 microinches and above | 0.300 inches | 0.900 inches | 1.600 inches |

The textured exposed surface 422 may be the surface of a coating 420, or of a bulk component 410, that is treated to have the desired texture. In one embodiment, as shown in FIG. 2, the textured exposed surface 422 is a surface of a coating 420 on an underlying roughened surface 436 of a component 410, as for example, shown in FIG. 2. In this version, the component 410 may be formed from a dielectric material into the desired shape, roughened, and then coated by a coating process, such as plasma spraying. For example, the dielectric may be formed as a dielectric preform having the desired shape. In one embodiment, the dielectric is made of a material that is permeable to RF energy, such as to be substantially transparent to RF energy from the plasma generator 330. For example, the dielectric may be a ceramic material, such as quartz or aluminum oxide. An exemplary component 410 is the domed enclosure wall 120 that serves as the ceiling 140, and that is made from a dielectric material such as quartz.

The component 410 is surface roughened to particular levels that provide at least some of the final texture of the exposed surface 422. The roughened surface 436 is coated with a plasma sprayed coating 420 that at least partially conforms to the surface 436 while also imparting additional texture characteristics, to provide a textured exposed surface 422 that significantly improves the adhesion of the sputter etched material onto the component 410. The coating 420 may be made of a material 425, such as a ceramic material, such as, for example, $Al_2O_3$, $TiO_2$, or mixtures thereof.

The coating 420 can also advantageously decrease the amount of outgassing from the exposed chamber surfaces 422. The coating 420, shown in FIG. 2, may have a thickness suitable to avoid excessive outgassing. In one embodiment, the coating 420 has a thickness of less than about 10 mils (~254 micrometers), for example, a thickness of from about 1 mil (~25 micrometers) to about 8 mils (~203 micrometers), or a thickness of from about 3 mils (~76 micrometers) to about 5 mils (~127 micrometers).

The coating material 425 may also be tailored to have a porosity that is sufficiently high to promote the adherence of chamber generated particulate matter onto the surface 422. The porosity of the coating material 425 is the ratio of the volume of pore interstices to the volume of its mass. For example, the coating material 425 may have a porosity of from about 5% to about 10%, such as about 7%.

Figure 3A:
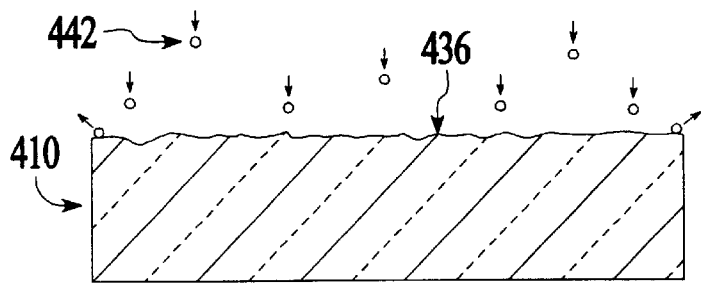
FIG. 3a is a cross-sectional view of a surface of a component being roughened.
Figure 3B:
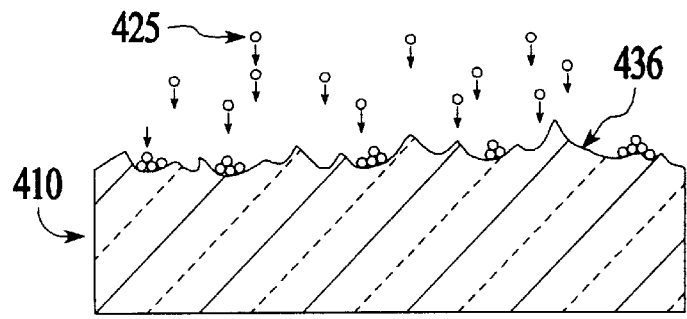
FIG. 3b is a cross-sectional view of the component of FIG. 3a after the surface has been roughened and while a plasma sprayed coating is being applied thereto.
Figure 3C:
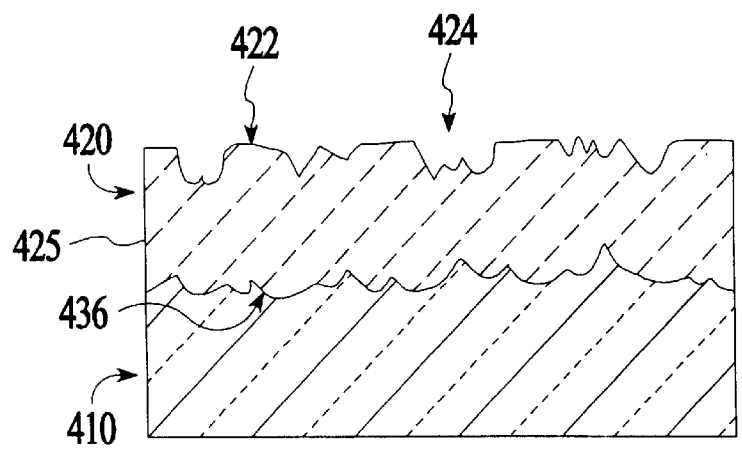
FIG. 3c is a cross-sectional view of the final textured exposed surface of the component of FIG. 3b.

In one version, the coating 420 is applied to the surface 436 of the component 410 in the below-described steps, an embodiment of which is illustrated in FIGS. 3a to 3c. Prior to the application of the coating 420, the underlying surface 436 of the component 410 is typically smooth, as shown in FIG. 3a. Referring to FIG. 3a, the underlying surface 436 is then roughened to provide a basis for the characteristics of the surface morphology of the overlying coating 420. The surface 436 may be roughened by bead blasting the surface 436. In bead blasting, solid beads 442 are propelled toward the surface 436 by air at a pressure that is sufficiently high to suitably roughen the surface 436, such as for example, a pressure of from about 40 to about 50 pounds per square inch (psi). Also, the angle of incidence of the beads 442 relative to the surface 436 is selected to roughen the surface 436 to promote adherence of the sputtered material to the final coating 420, such as from about 30 degrees to about 60 degrees. For example, the angle of incidence of the beads 442 relative to the surface 436 may be about 45 degrees.

In one embodiment, a bead blaster (not shown) in an enclosed housing is used to roughen the surface of the component 410. The beads may comprise a material having a hardness higher than that of the component 410 to allow the beads to erode and roughen the surface of the component 410 to form the roughened surface 436. Suitable bead materials include for example, alumina oxide, glass, silica, or hard plastic. In one embodiment, the beads comprise a grit of aluminum oxide having a mesh size selected to suitably grit blast the surface 436, such as for example, a grit of aluminum oxide particles having a mesh size of 36. The surface 436 is roughened to have a roughness average, of for example, from about 150 microinches (~3 micrometers) to about 450 microinches (~18 micrometers), or even from about 360 microinches (~9 micrometers) to about 400 microinches (~10 micrometers). Additionally, the standoff distance traveled by the beads 442 from the bead blaster to the component is also set to provide the desired roughness of the surface 436.

For example, the standoff distance may be from about 4 inches to about 6 inches from the bead blasting source to the component surface 436.

After bead blasting, the surface 436 is cleaned to improve the subsequent adhesion and retention of the coating material 420. For example, the surface 436 can be cleaned by blowing clean dry air or nitrogen gas across the surface 436. Subsequently, in one version, the surface 436 is further cleaned, for example chemically, using distilled water, or in an ultrasonic rinse. Additionally, the component 410 is baked in an oven to bake out any residues, such as from the cleaning process. For example, the component surface 436 may be baked at a temperature of at least about 100° Celsius. to improve the subsequent deposition of the coating material 420 onto the surface 436.

After cleaning of the component surface 436, a coating 420 is plasma sprayed onto the surface 436 as for example, as illustrated in FIG. 3b. In plasma spraying, a plasma is formed to atomize and at least partially liquefy a spray of particulate coating material 425 injected through the plasma. For example, the plasma may liquefy the coating material 425 by heating the coating material 425 to a temperature of thousands of degrees Celsius. The liquified droplets of the coating material 425 impinge at high velocities on the roughened underlying surface 436 and rapidly solidify to form a conformal coating 420, as shown in FIG. 3c.

Figure 6:
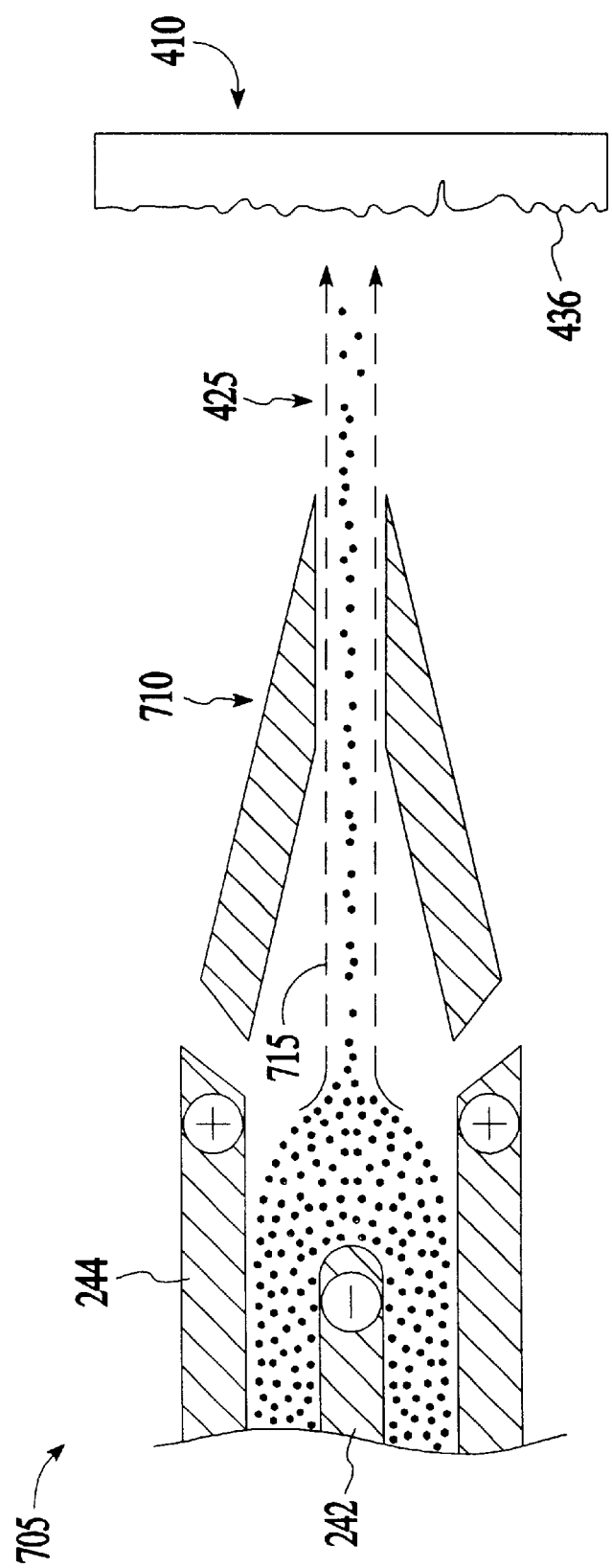
FIG. 6 is a cross-sectional view of a plasma torch depositing a coating material on a roughened surface of a component.

In one version, a plasma spray torch 705 is used to plasma spray the coating material 425 onto the surface 436, as shown in FIG. 6. The plasma torch 705 may be mounted on a controllable robotic arm (not shown) to adjust the distance and angle of the plasm torch 705 from the surface 436. Also, the plasma torch 705 may be inside a chamber (not shown) to control the gas environment in which the plasma torch 705 is immersed.

In the plasma torch 705, a carrier gas is flowed between two electrodes, such as a cathode 242 and an anode 244. The carrier gas is suitable to form a high-pressure plasma, such as argon, nitrogen, hydrogen, or helium. Argon may be used because it is chemically inert and because of its ionization characteristics. Adding diatomic gases, such as hydrogen or nitrogen, can increase the enthalpy of the gas. The cathode 242 and anode 244 comprise materials suitable to generate an electric discharge arc through the plasma, such as metals like tungsten or copper. In one embodiment, the cathode 242 is made of tungsten and the anode 244 is made of copper. Additionally, in one version, the anode is cooled, for example water-cooled, to prevent overheating. The cathode 242 and the anode 244 may be correspondingly shaped to suitably generate an electric arc between them. For example, the cathode 242 may be cone-shaped and the anode 244 may be cylindrical.

An AC high-frequency discharge initiates an electric arc between the cathode 242 and the anode 244 and is sustained using DC power. The electric arc ionizes the carrier gas, creating a high-pressure plasma. The resulting increase in gas temperature increases the volume of the gas and, thus, the pressure and velocity of the gas as it exits a nozzle 710. The coating material 425 is introduced into the gas stream 715 in powder form. The powdered coating material 425 can be introduced just outside the plasma torch 705 or in the diverging exit region of the nozzle 710. The coating material 425 is heated and accelerated by the high-temperature, high-velocity plasma stream.

Operating parameters of the plasma torch 705 are selected to be suitable to adjust the characteristics of the coating material application, such as the temperature and velocity of the coating material 425 as it traverses the path from the plasma torch 705 to the component surface 436. For example, gas flows, power levels, powder feed rate, carrier gas flow, standoff distance from the plasma torch 705 to the substrate 110, and the angle of deposition of the coating material 425 relative to the component surface 436 can be adapted to improve the application of the coating material 425 and the subsequent adherence of the coating 420 to sputtered material. For example, the voltage between the cathode 242 and the anode 244 may be selected to be from about 30 Volts to about 60 Volts, such as about 45 Volts. Additionally, the current that flows between the cathode 242 and the anode 244 may be selected to be from about 500 Amps to about 700 Amps, such as about 600 Amps. The power level of the plasma torch 705 is usually in the range of from about 12 to about 120 kiloWatts, such as about 80 kiloWatts.

The standoff distance and angle of deposition can be selected to adjust the deposition characteristics of the coating material 425 on the surface 436. For example, the standoff distance and angle of deposition can be adjusted to modify the pattern in which the molten coating material 425 splatters upon impacting the surface 436, to form for example, "pancake" and "lamella" patterns. The standoff distance and angle of deposition can also be adjusted to modify the phase, velocity, or droplet size of the coating material 425 when it impacts the surface 436. In one embodiment, the standoff distance between the plasma torch 705 and the substrate 110 is from about 2 inches to about 4 inches, such as about 3 inches. The angle of deposition of the coating material 425 onto the surface 436 may be from about 75 degrees to about 105 degrees relative to the surface 436, such as about 90 degrees.

The velocity of the powdered coating material 425 can be adjusted to suitably deposit the coating material 425 on the surface 436. In one embodiment, the velocity of the powdered coating material 425 is from about 300 to about 550 meters/second. Also, the plasma torch 705 may be adapted so that the temperature of the powdered coating material 425 is at least about the melting temperature of the coating material 425 when the powdered coating material 425 impacts the component surface 436. Temperatures above the melting point can yield a coating 420 of high density and bonding strength. For example, the temperature of the plasma may exceed 30,000° C. In one embodiment, the bonding strength is from about 29 MPa to about 75 MPa. However, the temperature of the plasma about the electric discharge can also be set to be sufficiently low that the coating material 425 remains molten for a period of time upon impact with the component surface 436. For example, an appropriate period of time may be at least about 0.02 seconds or at least about 0.1 seconds.

A process chamber 100 having a component 410 with a textured surface 422 according to the present invention, an embodiment of which is shown in FIG. 3c, has significant advantages over a conventional process chamber (not shown) without such a textured surface 422. For example, the process chamber 100 can reduce redeposition of sputtered material onto the substrate 110 by a factor of five. The bar graph of FIG. 7 shows a normalized number of particles redeposited per substrate 110 as a function of whether the chamber has conventional components (the left bars 830) or components 410 with a textured surface 422 according to the present invention (the right bars 835), and also as a function of the redeposition of particle sizes in micrometers. The data points are based on measurements of 11 substrates using two conventional sets of components, and 50 substrates 110 using four sets of components 410 having the textured surfaces 422 according to the present invention. The left and right bars 830, 835 of each bar pair correspond to the amount of redeposition onto a substrate (not shown) in a conventional process chamber with conventional internal surfaces and a substrate 110 in a process chamber 100 having components 410 with textured surfaces 422 according to the present invention, respectively. By comparing the left and right bars 830, 835 across the ranges of particle sizes, one can see that the redeposition of material onto the substrate 110 is typically reduced about 5 times using the textured surface components 410.

Additionally, components 410 having a textured exposed surfaces 422 typically have a longer operational lifetime than other conventional components (not shown). In one embodiment, the lifetime of these components is prolonged by at least about 4 times over conventional components, as shown in the bar graph of FIG. 8. A normalized number of redeposited particles of size greater than 0.5 micrometers per operation is plotted, where each bar represents an operation. The bars are arranged chronologically from left to right, and reference number 840 indicates when the components 410 were replaced. The bars on the left side 820 represent operations in a process chamber using a conventional components, while bars on the right side 825 represent operations in a process chamber 100 having components 410 with surfaces 422 that are textured according to the present invention. The data points are based on measurements of 11 substrates using chambers with two sets of conventional components, and 50 substrates using chambers with four sets of textured surface components 410. The bar 815 is an bad data point that should be disregarded because conventional components used in a corresponding similar operation also provided bad data. The medians of the bar heights on the left and right sides are shown by a vertical line 805 on the left and another vertical line 810 on the right. By comparing the median particle redeposition values on the left and right sides 820, 825, respectively, one can see that the particle redeposition amounts are typically reduced by at least about 4 times by using components 410 according to the present invention. The component lifetime, which is about proportional to the rate of redeposition of the particles, is thus also typically reduced by at least about 4 times.

The process chamber 100 may also include additional systems, such as for example, a process monitoring system (not shown) comprising one or more detectors (not shown) that are used to detect or monitor process conditions continuously during an operation of the process chamber 100, or monitor a process being conducted on the substrate 110. The detectors include, for example, but are not limited to, a radiation sensing device (not shown) such as a photomultiplier or optical detection system; a gas pressure sensing device (not shown) such as a pressure gauge, for example, a manometer; a temperature sensing device (not shown) such as a thermocouple or RTD; ammeters and voltmeters (not shown) to measure the currents and voltages applied to the chamber components 415; or any other device capable of measuring a process condition in the process chamber 100 and providing an output signal, such as an electrical signal, that varies in relation to the measurable process condition. For example, the process monitoring system can be used to determine the thickness of a layer being processed on the substrate.

Figure 4:
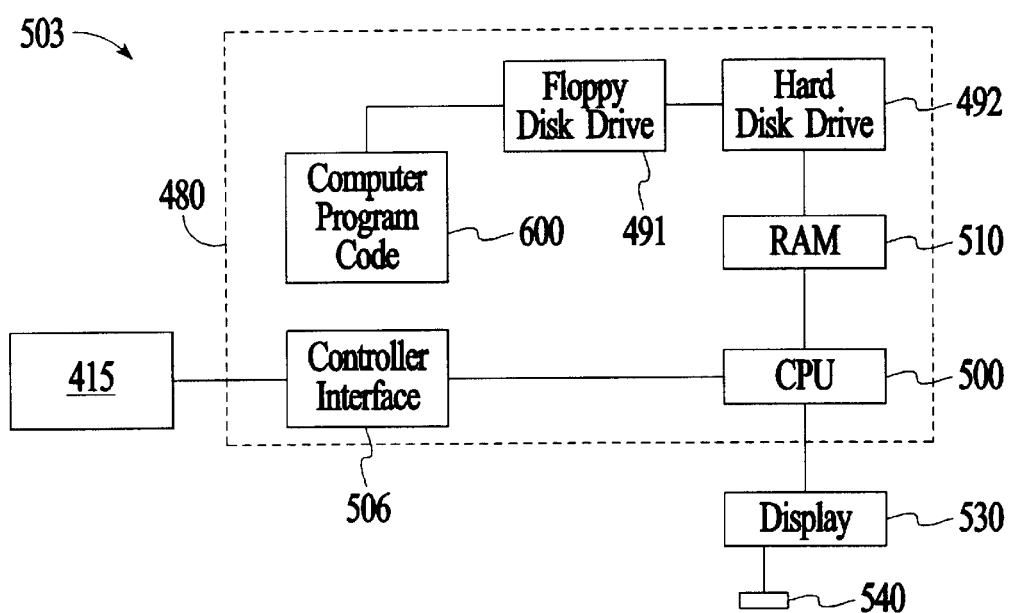
FIG. 4 is a schematic diagram of an embodiment of a controller of a process chamber.

A controller 480 controls operation of the chamber 100 by transmitting and receiving electrical signals to and from the various chamber components and systems. For example, the process conditions measured by the process monitoring system in the process chamber 100 may be transmitted as electrical signals to a controller 480, which then changes process conditions when the signal reaches a threshold value. Although the controller 480 is illustrated by way of an exemplary single controller device in FIG. 4 to simplify the description of the present invention, it should be understood that the controller 480 may be a plurality of controller devices that are connected to one another or a plurality of controller devices that are connected to different components 415 of the process chamber 100; thus, the present invention should not be limited to the illustrative and exemplary embodiments described herein.

In one embodiment, the controller 480 comprises electronic hardware including electrical circuitry comprising integrated circuits that is suitable for operating the process chamber 100. Generally, the controller 480 is adapted to accept data input, run algorithms, produce useful output signals, and may also be used to detect data signals from the detectors and other chamber components 415, and to monitor or control the process conditions in the process chamber 100. For example, the controller 480 may comprise (i) a computer comprising a central processing unit 500 (CPU), which is interconnected to a memory system with peripheral control components, (ii) application specific integrated circuits (ASICs) (not shown) that operate particular components 415 of the process chamber 100, and (iii) one or more controller interface boards (not shown) along with suitable support circuitry. Typical central CPUs 500 include the PowerPC™, Pentium™, and other such processors. The ASICs are designed and preprogrammed for particular tasks, such as retrieval of data and other information from the process chamber 100, or operation of particular chamber components 415. The controller interface boards are used in specific signal processing tasks, such as for example, to process a signal from the process monitoring system and provide a data signal to the central processing unit (CPU) 500. Typical support circuitry includes, for example, co-processors, clock circuits, cache, power supplies, and other well known components that are in communication with the CPU 500. For example, the CPU 500 often operates in conjunction with a random access memory (RAM) 510, a read-only memory (ROM, not shown), and other storage devices well known in the art. The RAM 510 can be used to store the software implementation used in the present system during process implementation. The controller 480 comprises a controller interface 506 to connect the controller 480 to other chamber components 415.

The output of the CPU 500 is passed to a display 530 or other communicating device. Input devices 540 allow an operator to input data into the controller 480 to control operations or to alter the software in the controller 480. For example, the interface between an operator and the computer system may be a CRT monitor (not shown) and a light pen (not shown). The light pen detects light emitted by the CRT monitor with a light sensor in the tip of the pen. To select a particular screen or function, the operator touches a designated area of the CRT monitor and pushes a button on the pen. The area touched changes its color or a new menu or screen is displayed to confirm the communication between the light pen and the CRT monitor. Other devices, such as a keyboard, mouse, or pointing communication device can also be used to communicate with the controller 480. In one embodiment, two monitors (not shown) are used, one mounted in a clean room wall for operators and the other behind the wall for service technicians. Both monitors (not shown) simultaneously display the same information, but only one light pen is enabled.

Figure 5:
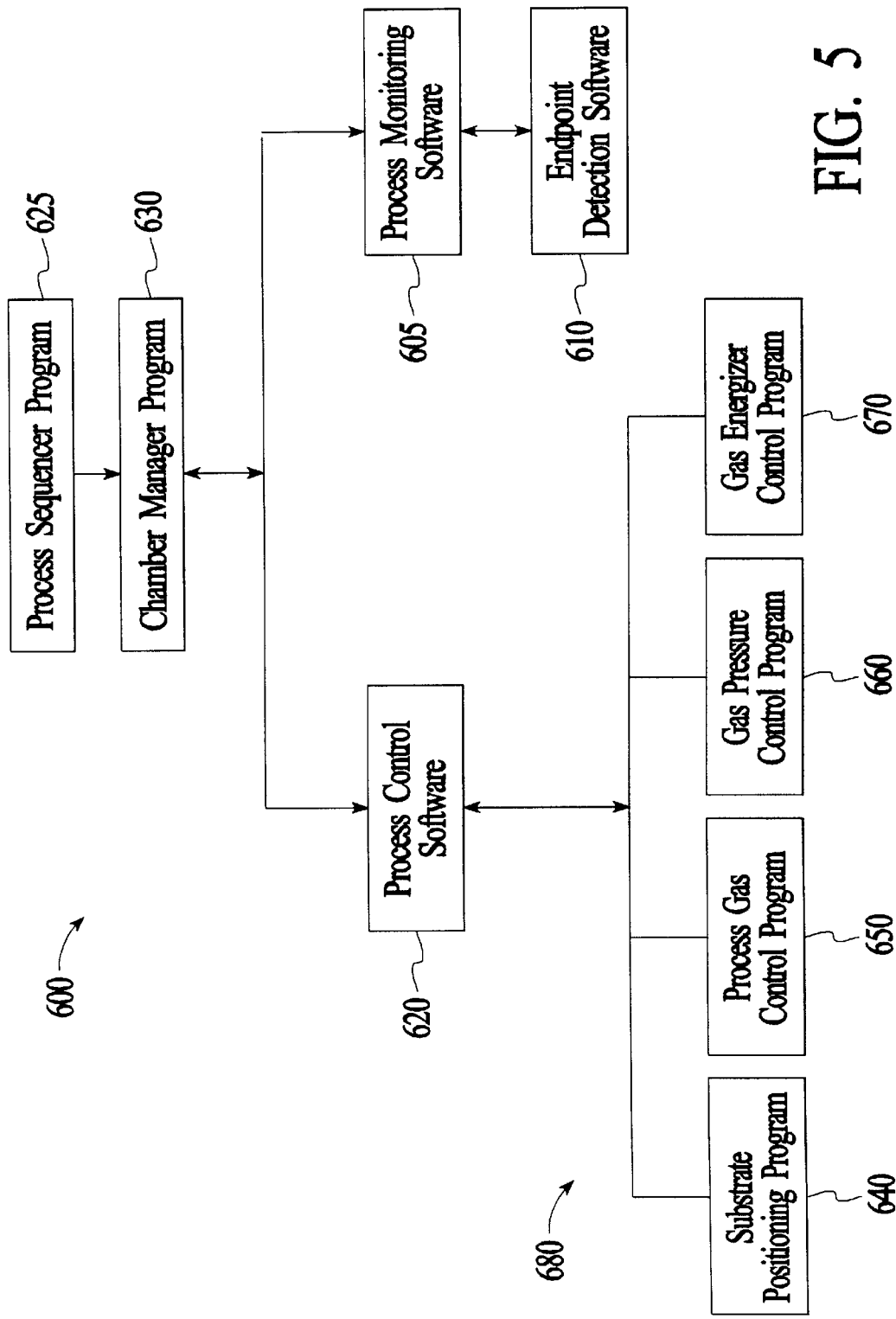
FIG. 5 is a schematic diagram of an embodiment of a computer program code.

The computer program code 600 of the controller 480 may be stored in a memory device, such as a floppy disk 491 or the hard drive 492, and called into the RAM 510 during execution by the controller 480, as shown in FIG. 5. The computer program code may be written in conventional computer readable programming languages, such as for example, assembly language, C, C++, or Pascal. Suitable program code is entered into a single file, or multiple files, using a conventional text editor and stored or embodied in a computer-usable medium, such as a memory 503 of the computer system. If the entered code text is in a high level language, the code is compiled to a compiler code, which is linked with an object code of precompiled library routines. To execute the linked and compiled object code, the system operator invokes the object code, causing the computer system to load the code in memory 503 to perform the tasks identified in the computer program.

Typically, the computer program code 600 comprises one or more sets of computer instructions, including, for example, process monitoring software 605, endpoint detection software 610, and process control software 620 that dictates the timing, process gas composition, chamber pressure and temperature, RF power levels inside the process chamber 100, electrode positioning, and other process parameters of the process chamber 100. The computer program code 600 also controls settings for power levels of the energy coupled to the plasma generator 330, the flow levels and composition of gas introduced into the process chamber 100, and the display 530. A preferred version of the computer program code 600 comprises multiple program code sets 680, such as a process sequencer program code 625 that allows an operator to enter and select a process recipe, and that executes operation of the process recipe in a selected process chamber 100 and chamber manager program code 630 for operating and managing priorities of the chamber processes in the process chamber 100. While illustrated as separate program code sets 680 that perform a set of tasks, it should be understood that these program code sets 680 can be integrated, or the tasks of one program code integrated with the tasks of another program code to provide a desired set of tasks. Thus the controller 480 and computer program code 600 described herein should not be limited to the specific embodiment of the program codes described herein or housed as shown herein, and other sets of program code or computer instructions that perform equivalent functions are within the scope of the present invention.

In operation, an operator enters a process set and process chamber number into the process sequencer program code 625 via the input device 540. The process sets are composed of process parameters necessary to carry out a specific process in the chamber 100, and are identified by predefined set numbers. The process sequencer program code 625 identifies the desired set of process parameters needed to operate the process chamber 100 for performing a particular process. The process parameters include process conditions, such as for example, process gas composition and flow rates, chamber temperature and pressure, gas energizing parameters such as microwave or RF bias power levels and magnetic field power levels, cooling gas pressure, and chamber wall temperature.

The process sequencer program code 625 executes a process set by passing the particular process set parameters to the chamber manager program code 630 which controls the processing task in the process chamber 100 according to the process set. For example, the chamber manager program code 630 comprises program code for etching a substrate 110 or depositing material on a substrate 110. The chamber manager program code 630 controls execution of various chamber component program code sets 680 that control operation of chamber components 415. Examples of chamber component control program code include substrate positioning program code 640 that controls robot components that load and remove the substrate 110 onto the support 160, process gas control program code 650 that controls the composition and flow rates of the process gas supplied into the chamber 100 by the gas supply 260, gas pressure control program code 660 that sets the size of the opening of one or more gas valves, such as a throttle valve, and plasma generator program code 670 that controls the power level of the plasma generator 330. In operation, the chamber manager program code 630 selectively calls the chamber component program code sets 680 in accordance with the particular process set being executed, schedules the chamber component program code sets 680, monitors operation of the various chamber components 415, determines which component 415 needs to be operated based on the process parameters for the process set to be executed, and causes execution of a chamber component program code set 680 responsive to the monitoring steps. These are merely examples of chamber component program code sets 680.

Although the present invention has been described in considerable detail with regard to certain preferred versions thereof, other versions are possible. For example, the present invention could be used with other process chambers, such as a chemical vapor deposition (CVD) process chamber or an etching chamber. The process chamber 100 may also comprise other equivalent configurations as would be apparent to one of ordinary skill in the art. As another example, one or more components 410 of the process chamber 100 may comprise a plurality of different coatings 420. Thus, the appended claims should not be limited to the description of the preferred versions contained herein.

What is claimed is:

1. A component for a plasma processing chamber, the component comprising a ceramic coating on a dielectric material, the ceramic coating comprising a textured exposed surface having a roughness with an average skewness across the textured exposed surface that is a negative value and less than about −0.1, whereby sputtered material generated by a plasma in a plasma processing chamber may adhere to the textured exposed surface.

2. A component according to claim 1 wherein the average skewness is an average of a plurality of measured skewness values that range from about −0.7 to about 0.1.

3. A component according to claim 1 wherein the dielectric material has a roughened surface, the roughened surface having the ceramic coating deposited thereon, and wherein the roughened surface has a roughness average of from about 150 to about 450 microinches.

4. A component according to claim 1 wherein the component comprises an enclosure wall.

5. A component according to claim 1 wherein the ceramic coating comprises a porosity of from about 5% to about 10%.

6. A component according to claim 1 wherein the ceramic coating has a thickness of from about 25 micrometers to about 203 micrometers.

7. A component according to claim 1 wherein the dielectric material comprises quartz or aluminum oxide.

8. A component according to claim 1 wherein the ceramic coating comprises aluminum oxide or titanium oxide.

9. A wall for a plasma processing chamber, the wall comprising:

a dielectric material comprising a roughened surface; and a ceramic coating on the roughened surface of the dielectric material, the coating comprising a textured exposed surface having a roughness with an average skewness across the textured exposed surface that is a negative value and less than about −0.1, whereby sputtered material generated by a plasma in a plasma processing chamber may adhere to the textured exposed surface.

10. A wall according to claim 9 wherein the average skewness is an average of a plurality of measured skewness values that range from about −0.7 to about 0.1.

11. A wall according to claim 9 wherein the roughened surface has a roughness average of from about 150 to about 450 microinches.

12. A wall according to claim 9 wherein the ceramic coating is plasma sprayed onto the roughened surface of the dielectric material.

13. A wall according to claim 9 wherein the ceramic coating comprises a porosity of from about 5% to about 10%.

14. A wall according to claim 9 wherein the ceramic coating has a thickness of from about 25 micrometers to about 203 micrometers.

15. A wall according to claim 9 wherein the dielectric material comprises quartz or aluminum oxide.

16. A wall according to claim 9 wherein the ceramic coating comprises aluminum oxide or titanium oxide.

17. A wall for a plasma processing chamber, the wall comprising:

a dielectric material comprising a roughened surface having a roughness average of from about 150 to about 450 microinches; and a ceramic coating on the roughened surface of the dielectric material, the coating comprising a textured exposed surface having a roughness with an average skewness across the textured exposed surface that is a negative value and less than about −0.1, whereby sputtered material generated by a plasma in a plasma processing chamber may adhere to the textured exposed surface.

18. A wall according to claim 17 wherein the ceramic coating is plasma sprayed onto the roughened surface of the dielectric material.

19. A wall according to claim 17 wherein the average skewness is an average of a plurality of measured skewness values that range from about −0.7 to about 0.1.

20. A wall according to claim 17 wherein the ceramic coating comprises a porosity of from about 5% to about 10%.

21. A wall according to claim 17 wherein the ceramic coating has a thickness of from about 25 micrometers to about 203 micrometers.

22. A wall according to claim 17 wherein the dielectric material comprises quartz or aluminum oxide.

23. A wall according to claim 17 wherein the ceramic coating comprises aluminum oxide or titanium oxide.

24. A domed enclosure wall for a plasma processing chamber, the domed enclosure wall comprising:
   a dielectric material comprising a roughened surface having a roughness average of from about 150 to about 450 microinches; and
   a plasma sprayed ceramic coating deposited on the roughened surface of the dielectric material, the plasma sprayed ceramic coating comprising a textured exposed surface having a roughness with an average skewness across the textured exposed surface that is a negative value and less than about −0.15,
   whereby sputtered material generated by a plasma in a plasma processing chamber may adhere to the textured exposed surface.

25. A wall according to claim 24 wherein the average skewness is an average of a plurality of measured skewness values that range from about −0.7 to about 0.1.

26. A wall according to claim 24 wherein the plasma sprayed ceramic coating comprises a porosity of from about 5% to about 10%.

27. A wall according to claim 24 wherein the plasma sprayed ceramic coating comprises aluminum oxide, titanium oxide, or mixtures thereof.

28. A wall according to claim 24 wherein the ceramic coating has a thickness of from about 25 micromotors to about 203 micrometers.

29. A wall according to claim 24 wherein the dielectric material comprises a ceramic material.

30. A wall according to claim 29 wherein the ceramic material comprises quartz or aluminum oxide.

31. A wall for a plasma processing chamber, the wall comprising:
   a dielectric material comprising quartz having a roughened surface, the roughened surface having a roughness average of from about 150 to about 450 microinches; and
   a plasma sprayed ceramic coating deposited on the roughened surface of the dielectric material, the ceramic coating comprising at least one of $Al_2O_3$ and $TiO_2$, the ceramic coating comprising a textured exposed surface having a roughness with an average skewness across the textured exposed surface that is a negative value and less than about −0.1,
   whereby sputtered material generated by a plasma in a plasma processing chamber may adhere to the textured exposed surface.

32. A wall according to claim 31 wherein the average skewness is an average of a plurality of measured skewness values that range from about −0.7 to about 0.1.

33. A wall according to claim 31 wherein the plasma sprayed ceramic coating comprises a porosity of from about 5% to about 10%.

34. A wall according to claim 31 wherein the roughened surface has a roughness average of from about 360 to about 400 microinches.

35. A wall according to claim 31 wherein the dielectric material comprises quartz or aluminum oxide.

* * * * *